United States Patent
Gupta et al.

(10) Patent No.: US 10,622,038 B2
(45) Date of Patent: Apr. 14, 2020

(54) HIGH-SPEED MEMORY ARCHITECTURE

(71) Applicant: Arm Limited, Cambridge (GB)

(72) Inventors: Lalit Gupta, Cupertino, CA (US); Fakhruddin Ali Bohra, San Jose, CA (US); Jitendra Dasani, Cupertino, CA (US); Shri Sagar Dwivedi, San Jose, CA (US); Vivek Nautiyal, Milpitas, CA (US); Gaurav Rattan Singla, San Jose, CA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/024,449

(22) Filed: Jun. 29, 2018

(65) Prior Publication Data

US 2020/0005836 A1    Jan. 2, 2020

(51) Int. Cl.

| | |
|---|---|
| *G11C 7/00* | (2006.01) |
| *G11C 7/12* | (2006.01) |
| *G11C 8/14* | (2006.01) |
| *G11C 7/22* | (2006.01) |
| *G11C 7/18* | (2006.01) |

(52) U.S. Cl.
CPC ............ *G11C 7/12* (2013.01); *G11C 7/18* (2013.01); *G11C 7/222* (2013.01); *G11C 8/14* (2013.01)

(58) Field of Classification Search
CPC ........... G11C 8/12; G11C 7/18; G11C 7/1006; G11C 7/10; G11C 5/025
USPC .......................... 365/230.03, 189.02
See application file for complete search history.

(56) References Cited

U.S. PATENT DOCUMENTS 7,043,672 B2 *  5/2006  Merritt ................ G11C 7/1006
                                                                714/710

* cited by examiner

*Primary Examiner* — Son T Dinh
(74) *Attorney, Agent, or Firm* — Pramudji Law Group PLLC; Ari Pramudji

(57) ABSTRACT

Various implementations described herein refer to an integrated circuit having memory circuitry having multiple banks of bitcell arrays including a first pair of bank arrays and a second pair of bank arrays. The first pair of bank arrays may have a first number of rows, and the second pair of bank arrays have a second number of rows that is different than the first number of rows. The integrated circuit may include bank multiplexer circuitry that is coupled to the first pair of bank arrays via a first channel and the second pair of bank arrays via a second channel that is separate from the first channel. The bank multiplexer circuitry may provide an output data signal from the first pair of bank arrays or the second pair of bank arrays based on a control signal.

20 Claims, 5 Drawing Sheets

HIGH-SPEED MEMORY ARCHITECTURE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits can be designed as memory. Due to the downward scaling of transistors in modern circuitry, the geometric scaling of metal routing can increase back-end wire RC load (i.e., resistor-capacitor load), which can degrade memory operation speed (i.e., static random access memory operation speed). For instance, since transistor geometry is being scaled down, metal geometry is also scaled down. As such, resistance (R) of metal geometry and related capacitance (C) can become a significant problem with advanced nodes, so developing a bitline differential for a higher number of rows can be challenging. These challenging issues can adversely impact the timing and precharging of large RC of the bitline. These challenging issues can impact cycle time and power.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to high-speed optimized memory architecture that supports a higher number of rows in multi-bank applications to optimize power and timing including access time and cycle time. For instance, various implementations described herein are directed to an asymmetrical balancing of rows in multi-bank memory architecture. Therefore, some implementations described herein may provide for less rows in a top bitcell bank and more rows in a bottom bitcell bank, and as such, the signal timing path (STP) may be tuned separately for a bottom output channel and a top output channel. In this instance, the top output channel STP may be faster than the bottom output channel, which may compensate for top-to-bottom capacitance due to more resistance-capacitance (RC) load in the bottom bank than the top bank. In another instance, various implementations described herein are directed to placement of a clock buffer on a top channel in multi-bank memory architecture.

Various implementations of improved high-speed memory architecture will now be described in more detail with reference to FIGS. 1-5.

Figure 1:
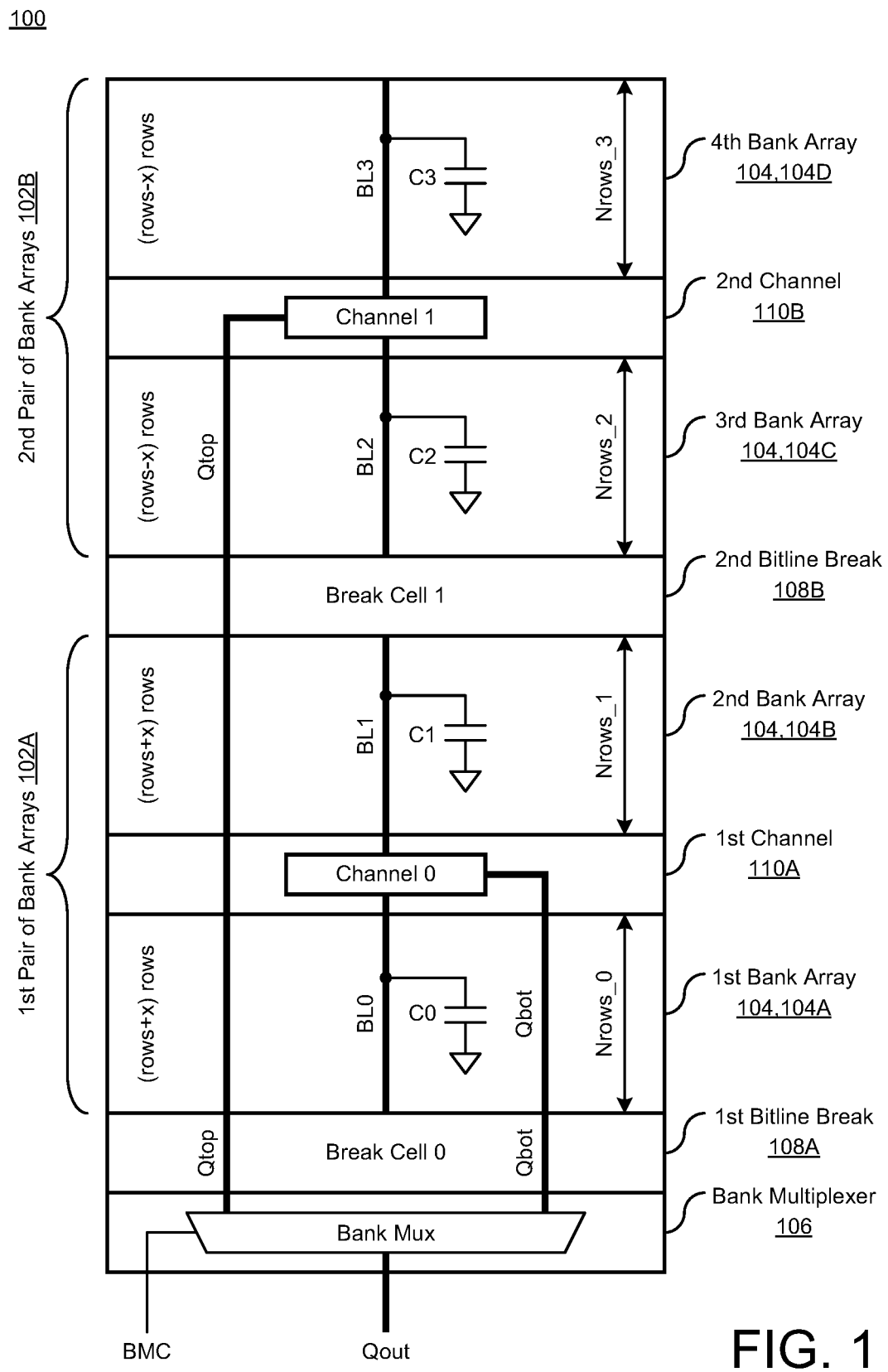
FIG. 1 illustrates a diagram of multi-bank memory circuitry in accordance with various implementations described herein.

FIG. 1 illustrates a diagram of multi-bank memory circuitry 100 in accordance with various implementations described herein.

As shown in FIG. 1, the memory circuitry 100 may include multiple banks of bitcell arrays 104 (i.e., 104A, 104B, 104C, 104D) including a first pair of bank arrays 102A (i.e., bottom pair) and a second pair of bank arrays 102B (i.e., top pair). The first pair of bank arrays 102A may be referred to as a first pair of bitcell arrays having a first number of rows (rows+x), and the second pair of bank arrays 102B may be referred to as a second pair of bitcell arrays having a second number of rows (rows-x) that is different than the first number of rows (rows+x). In some instances, the variable number (x) may refer to a variable number of rows that is added (+) or subtracted (−) from a number or rows in each bank. For instance, a distribution of rows may refer to an even distribution of rows, such as, e.g., 1024 rows may be divided by 4 banks with each bank having 256 rows, and if (x) equals 100 rows, then each bank of the first pair of bank arrays 102A may each have a same number of (256+100=356) rows, and each bank of the second pair of bank arrays 102B may each have a same number of (256−100=256) rows.

In some implementations, the second number of rows (rows-x) may have a sum of rows (e.g., sum<256) that is asymmetrically balanced with a sum of rows (e.g., sum>256) of the first number of rows (rows+x). In some instances, the asymmetrical balancing of the second number of rows (rows-x) with respect to the first number of rows (rows+x) may provide a resistive-capacitive (RC) balancing between the multiple banks of bitcell arrays 102A, 102B. Thus, in various implementations, as described herein, the second number of rows (rows-x) is than the first number of rows (rows+x).

As shown in FIG. 1, the memory circuitry 100 may include bank multiplexer circuitry 106 that is coupled to the first pair of bank arrays 102A via a first channel 110A (i.e., channel 0) and the second pair of bank arrays 102B via a second channel 110B (i.e., channel 1) that is separate from the first channel 110A. The bank multiplexer circuitry 106 may provide an output data signal (Qout) from the first pair of bank arrays 102A or the second pair of bank arrays 102B based on a control signal BMC. In some instances, the control signal BMC may refer to a bankmux control signal that may be implemented with (or taken from) a bankmux bit used in an address signal. In some implementations, the first channel 110A may include first column multiplexer circuitry, and the second channel 110B may include second column multiplexer circuitry. The first column multiplexer circuitry may include a first sense amplifier having first latch circuitry that provides the output data signal as a latched output data signal. The second column multiplexer circuitry may include a second sense amplifier having second latch circuitry that provides the output data signal as another latched output data signal. The first pair of bitcell arrays 102A may share the first sense amplifier and the first latch circuitry, and the second pair of bitcell arrays 102B may share the second sense amplifier and the second latch circuitry.

The first pair of bank arrays 102A may include a first bank of bitcells 104A that is arranged in a first array having the first number of rows (rows+x), and the first pair of bank arrays 102A may include a second bank of bitcells 104B that is arranged in a second array having the first number of rows (rows+x). Thus, in some implementations, the first number of rows (rows+x) in the first bank of bitcells 104A may be similar or equal to the first number of rows (rows+x) in the second bank of bitcells 104B. The first bank of bitcells 104A and the second bank of bitcells 104B may share the first channel 110A (i.e., channel 0), and the first bank of bitcells 104A may be coupled to the first channel 110A with a first bitline (BL0), and the second bank of bitcells 104B may be coupled to the first channel 110A with a second bitline (BL1). The first bitline (BL0) may provide a first data signal from the first bank of bitcells 104A to the first channel 110A, and the second bitline (BL1) may provide a second data signal from the second bank of bitcells 104B to the first channel 110A. Also, the first channel 110A may provide the first data signal or the second data signal to the bank multiplexer circuitry 106 for output (Qbot) as the output data signal (Qout) from the first pair of bank arrays 102A based on the control signal BMC. Thus, the first pair of bank arrays 102A may be referred to as a bottom (bot) pair of bitcell arrays that provide a bottom output signal (Qbot) from the first channel 110A.

The second pair of bank arrays 102B may include a third bank of bitcells 104C that is arranged in a third array having the second number of rows (rows-x), and the second pair of bank arrays 102B may include a fourth bank of bitcells 104D that is arranged in a fourth array having the second number of rows (rows-x). Thus, in some implementations, the second number of rows (rows-x) in the third bank of bitcells 104C may be similar or equal to the second number of rows (rows-x) in the fourth bank of bitcells 104D. The third bank of bitcells 104C and the fourth bank of bitcells 104D may share the second channel 110B (i.e., channel 1), and the third bank of bitcells 104D may be coupled to the second channel 110B with a third bitline (BL2), and the fourth bank of bitcells 104D may be coupled to the second channel 110B with a fourth bitline (BL3). The third bitline (BL2) may provide a third data signal from the third bank of bitcells 104C to the second channel 110B, and the fourth bitline (BL3) may provide a fourth data signal from the fourth bank of bitcells 104D to the second channel 110B. Also, the second channel 110B may provide the third data signal or the fourth data signal to the bank multiplexer circuitry 106 for output (Qbot) as the output data signal (Qout) from the second pair of bank arrays 102B based on the control signal BMC. Thus, the second pair of bank arrays 102B may be referred to as a top (top) pair of bitcell arrays that provide a top output signal (Qtop) from the second channel 110B.

In some implementations, the first bank of bitcells 104A may develop or provide a first coupling capacitance (C0) relative to the first bitline (BL0), and the second bank of bitcells 104B may develop or provide a second coupling capacitance (C1) relative to the second bitline (BL1). Also, the third bank of bitcells 104C may develop or provide a third coupling capacitance (C2) relative to the third bitline (BL2), and the fourth bank of bitcells 104D may develop or provide a fourth coupling capacitance (C3) relative to the fourth bitline (BL3). Thus, as described herein above, the asymmetrical balancing of the second number of rows (rows-x) in the third and fourth banks of bitcells 104C, 104D with respect to the first number of rows (rows+x) in the first and second banks of bitcells 104A, 104B may provide a resistive-capacitive (RC) balancing between the multiple banks of bitcell arrays 104A, 104B, 104C, 104D. In this instance, as described herein, the second number of rows (rows-x) is at least less than the first number of rows (rows+x).

As also shown in FIG. 1, the memory circuitry 100 may include multiple bitline break cells 108A, 108B including a first bitline break cell 108A (i.e., break cell 0) and a second bitline break cell 108B (i.e., break cell 1). In this instance, the first bitline break cell 108A (i.e., break cell 0) may be disposed between the bank multiplexer 106 and the first bank of bitcells 104A (or first bank array), and the second bitline break cell 108B (i.e., break cell 1) may be disposed between the second bank of bitcells 104B (or second bank array) and the third bank array 104C (or third bank array).

Figure 2:
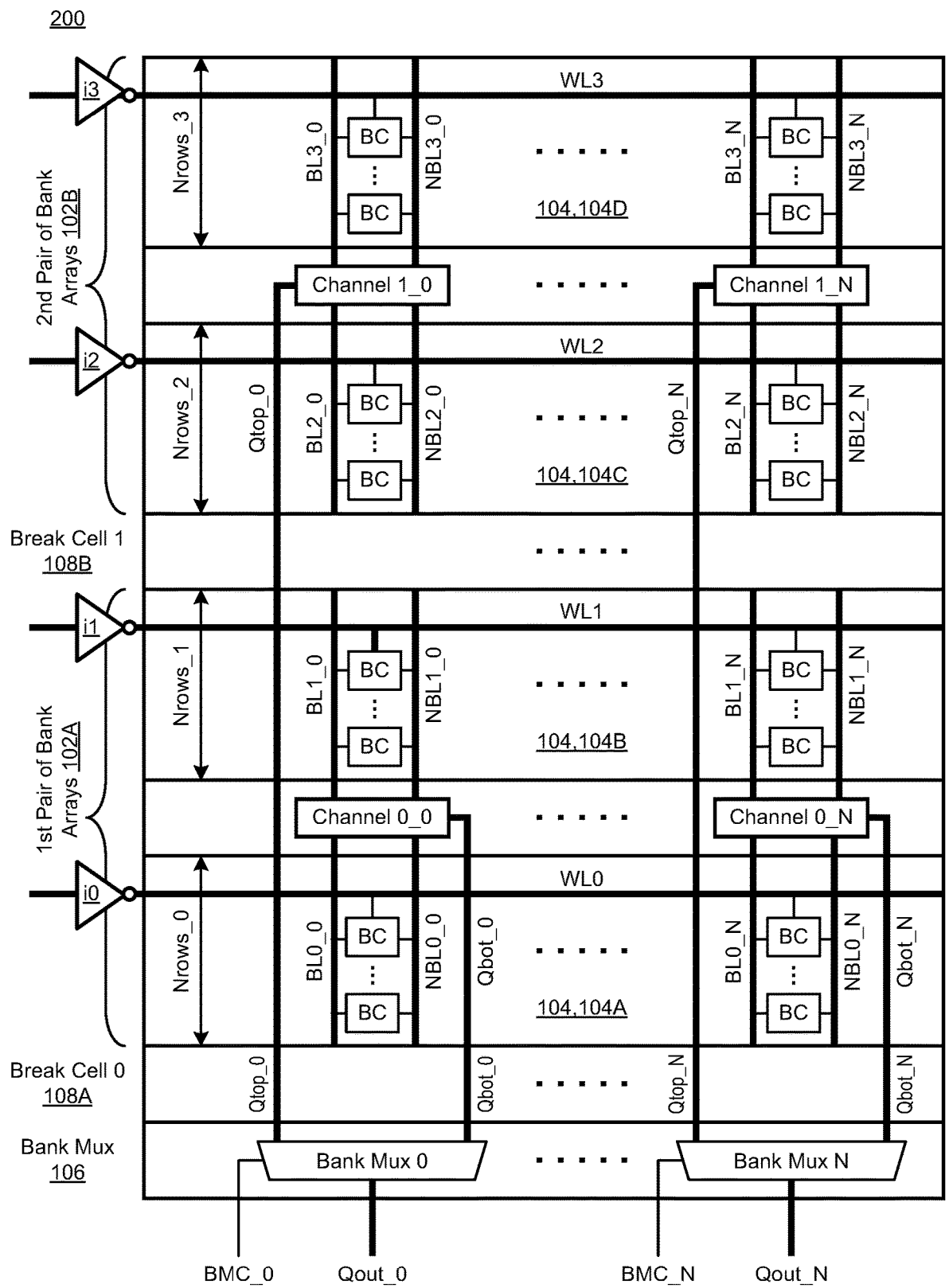
FIG. 2 illustrates a diagram of multi-bank memory circuitry in accordance with various implementations described herein.

FIG. 2 illustrates a diagram of multi-bank memory circuitry 200 in accordance with various implementations described herein. Various components that are described below in FIG. 2 are similar in scope, function, and operation as described in reference to the memory circuitry 100 as shown above in FIG. 1.

As shown in FIG. 2, the memory circuitry 200 may include a plurality of control lines, including multiple bitlines BL, NBL. The multiple bitlines BL, NBL may include lower bitlines arranged in multiple columns (BL0_0 . . . BL0_N, NBL0_0 . . . NBL0_N and BL1_0 . . . BL1_N, NBL1_0 . . . NBL1_N) for the first pair of bank arrays 102A. The multiple bitlines BL, NBL may also include upper bitlines arranged in multiple columns (BL2_0 . . . BL2_N, NBL2_0 . . . NBL2_N and BL3_0 . . . BL3_N, NBL3_0 . . . NBL3_N) for the second pair of bank arrays 102B. The bitlines BL, NBL may be complementary bitlines, and the bitlines BL, NBL may also be referred to as bitline pairs. The bitlines BL, NBL may be coupled to multiple wordlines (WL0, WL1, WL2, WL3) and also multiple channels (channel0_0 . . . channel0_N and channel1_0 . . . channel1_N). Also, the multiple channels may provide a corresponding output data signals (Qtop_0 . . . Qtop_N and Qbot_0 . . . Qbot_N).

In some implementations, the multiple channels (channel0_0 . . . channel0_N and channel1_0 . . . channel1_N) may refer to multiple column multiplexers (colmux), and a width of a colmux may be dependent on a column decoding function. For instance, column decoding may be as small as one column, but in practice, column decoding may be two or more columns of bitcells in multiples of 2, due to binary decoding. As such, the colmux may be some number (N) of columns, such as, e.g., 2, 4, 8, 16, or 32 columns, depending on column addressing, wherein a colmux is multiplexing between multiple columns of bitcells. As shown in FIG. 1, the colmux or channels show a single bitline pair input to the colmux. In some cases, a single bitline pair structure in a colmux or channel may be referred to as single bitline wide. In other cases, a multi-bitline pair structure in a colmux may be used and may be referred to as multi-bitline wide. Also, the memory circuitry 200 may include wordline drivers (WLD: i0, i1, i2, i3) that may be coupled to corresponding wordlines WLs (WL0, WL1, WL2, WL3). The term multiplexer and column multiplexer may refer to transistor structures.

Further, the memory circuitry 200 may include multiple bank multiplexers 106 (bank mux 0 . . . bank mux N) that are coupled to corresponding banks of bitcells 104A, 104B, 104C, 104D via the multiple channels (channel0_0 . . . channel0_N and channel1_0 . . . channel1_N). The bank multiplexer circuitry 106 may receive the corresponding output signals (Qtop_0 . . . Qtop_N and Qbot_0 . . . Qbot_N) from the banks of bitcells 104A, 104B, 104C, 104D via the multiple channels (channel0_0 . . . channel0_N and channel1_0 . . . channel1_N) and provide one or more output data signals (Qout_0 . . . Qout_N) based on corresponding control signals (BMC_0 . . . BMC_N). In some instances, as described herein, the control signals (BMC_0 . . . BMC_N) refer to bankmux control signals that may be implemented with (or taken from) a bankmux bit used in an address signal. Also, the multiple channels (channel0_0 . . . channel0_N and channel1_0 . . . channel1_N) may be implemented with column multiplexer circuitry.

It should be understood that, although the terms first, second, third and fourth may be used herein to describe various components, these components should not be limited by these terms, because these terms are only used to distinguish one component from another. For instance, a first component may be termed a second component, and, similarly, a second component may be termed a first component. Also, a third component may be termed a fourth component, and, similarly, a fourth component may be termed a third component. The first component, the second component, the third component and the fourth component are all components, respectively, but they should not be considered the same component. Likewise, although some components have been described as top and some have been described as bottom, it should be understood that in some implementations those top and bottom components may be used interchangeably.

The memory circuitry 200 includes bitcells (BC) that may be implemented as an integrated circuit (IC) with various types of memory, such as, e.g., RAM and/or other types of memory, including any type of volatile memory and non-volatile memory. The memory circuitry 100 and components therein may be implemented as an IC with single and/or dual rail memory architectures. Further, in some instances, the memory circuitry 200 may be integrated with computing circuitry and related components on a single chip, and the memory circuitry 200 may be implemented in an embedded system for various types of electronic, mobile, and/or biometric applications.

In some implementations, each of the bitcell arrays 104A, 104B, 104C, 104D may include multiple bitcells (BC), and each bitcell (BC) may be referred to as a memory cell, and each bitcell (BC) may be configured to store at least one data bit value (e.g., a data value related to a logical '0' or '1'). Each bitcell array 104A, 104B, 104C, 104D may include any number of bitcells arranged in various configurations, such as, e.g., a two-dimensional (2D) memory array having any number of columns and any number of rows of bitcells (BC) that are arranged in a 2D grid pattern with 2D indexing capabilities. Also, each bitcell (BC) may be implemented with random access memory (RAM), and/or some other type of memory. For instance, each bitcell (BC) may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit. In some instances, the memory circuitry 100 may operate at a source voltage level VDD with a voltage range that varies with technology.

Figure 3:
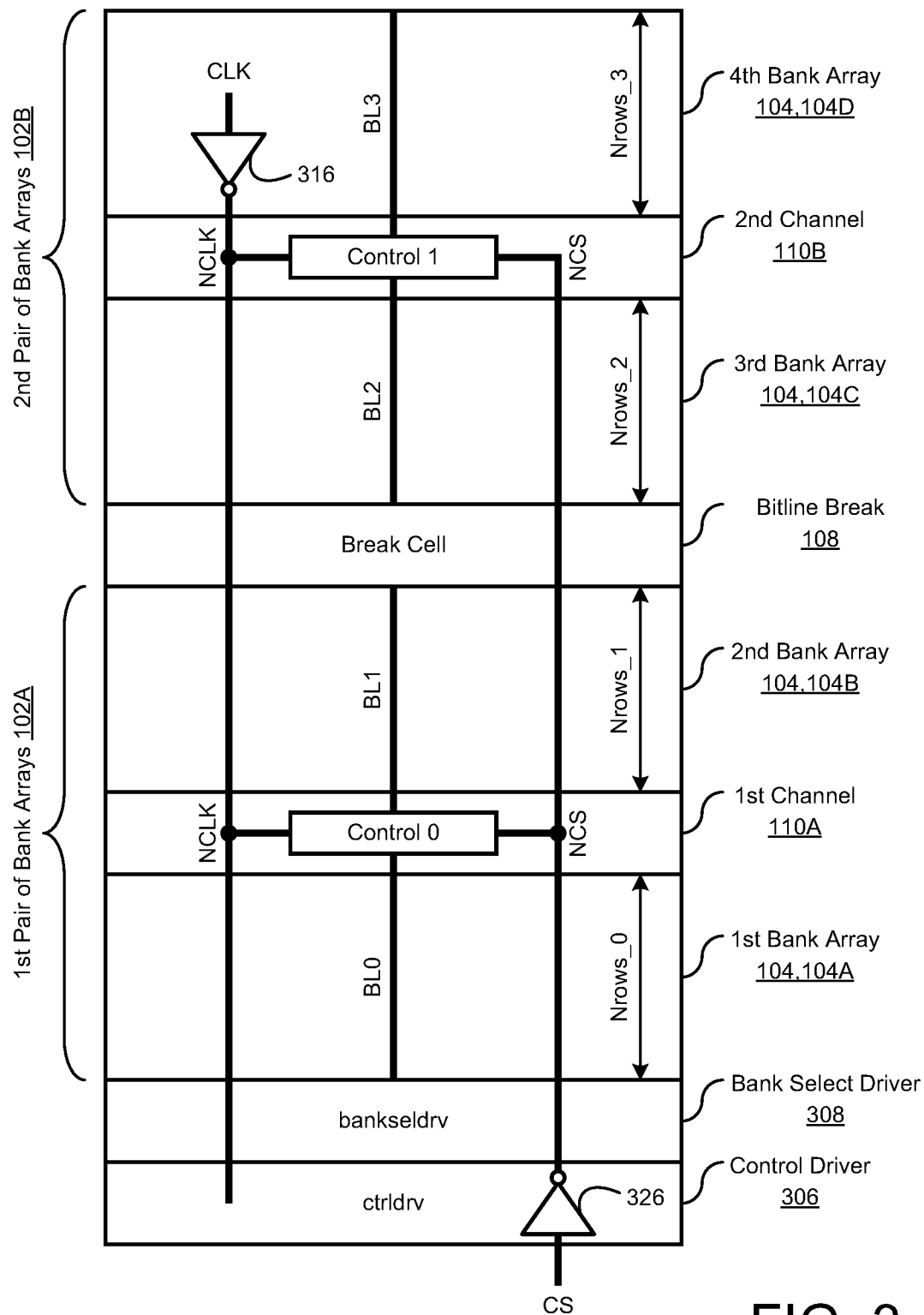
FIG. 3 illustrates a diagram of multi-bank memory circuitry in accordance with various implementations described herein.

FIG. 3 illustrates a diagram of multi-bank memory circuitry 300 in accordance with various implementations described herein. Various components that are described below in FIG. 3 are similar in scope, function, and operation as described in reference to the memory circuitry 100, 200 as shown above in FIGS. 1 and 2.

As shown in FIG. 3, the memory circuitry 300 may include the multiple banks of bitcell arrays 104 (i.e., 104A, 104B, 104C, 104D) including the first pair of bank arrays 102A (bottom pair) and the second pair of bank arrays 102B (top pair). As described herein above, the first pair of bank arrays 102A may include the first bank of bitcells 104A arranged in a first array and the second bank of bitcells 104B arranged in a second array. The second pair of bank arrays 102B may include the third bank of bitcells 104C arranged in a third array and the fourth bank of bitcells 104D arranged in a fourth array.

The memory circuitry 300 may include bank control circuitry 110A, 110B having a first control channel 110A (i.e., control 0) coupled to the first pair of bank arrays 102A (bottom pair) and a second control channel 110B (i.e., control 1) coupled to the second pair of bitcells arrays 102B (top pair). Also, the memory circuitry 300 may include a bank select driver 308 (i.e., bankseldrv) disposed between a control driver 306 (i.e., crtldrv) and the first bank of bitcells 104A.

The memory circuitry 300 may include clock drive circuitry having a clock driver 316 coupled to the first pair of bank arrays 102A (bottom pair) via the first control channel 110A (i.e., control 0) and the second pair of bank arrays 102B (top pair) via the second control channel (i.e., control 1) that is separate from the first control channel 110A (i.e., control 0). The clock driver 316 may drive the second pair of bank arrays 102B (top pair) via the second control channel 110B (control 1) before the first pair of bank arrays 102A (bottom pair) via the first control channel 110A (control 0). In some instances, the clock driver 316 may be implemented with a clock buffer that receives a clock input signal (CLK) and provides a buffered clock signal (NCLK) to the second pair of bank arrays 102B via the second control channel 110B (control 1) prior to the first pair of bank arrays 102A via the first control channel 110A (control 0). As shown, the clock buffer may be implemented with an inverter or other similar device.

The memory circuitry 300 may further include the control drive circuitry 306 (i.e., ctrldrv) having a control driver 326 coupled to the first pair of bank arrays 110A (bottom pair) via the first control channel 110A (control 0) and the second pair of bank arrays 102B (top pair) via the second control channel 110B (control 1) that is separate from the first control channel 110A (control 0). The control driver 326 may drive control of the first pair of bank arrays 102A (bottom pair) via the first control channel 110A (control 0) before the second pair of bank arrays 102B (top pair) via the second control channel 110B (control 1). In some instances, the control driver 326 may be implemented with a control buffer that receives a control input signal (CS) and provides a buffered control signal (NCS) to the first pair of bank arrays 102A via the first control channel 110A (control 0) prior to the second pair of bank arrays 102B via the second control channel 110B (control 1). As shown, the control driver 326 may be implemented with an inverter or other similar device.

As also shown in FIG. 3, the memory circuitry 300 may include at least one bitline break cell 108 (i.e., break cell). In this instance, the bitline break cell 108 (i.e., break cell) may be disposed between the bank select driver 308 and the first bank of bitcells 104A (or first bank array).

In some implementations, referring to FIG. 3, clock pin placement on the top channel 110A may optimize the output routing. For instance, by moving the clock pin to the top channel 110A, the clock signal path (CLK, NCLK) may be faster for the top channel 110A so as thereby to compensate for the output routing. Some advantages gained for this technique may refer to one or more of the following.

Dynamic power may be reduced when the top bank is accessed, and also, the clock pin power may be increased when the bottom bank is accessed. In some instances, access time may be improved compared to conventional schemes. Further, in reference to multi-bank architecture, the various schemes described herein may assist with improving the overall system frequency, e.g., by improving the multi-bank access time.

Figure 4:
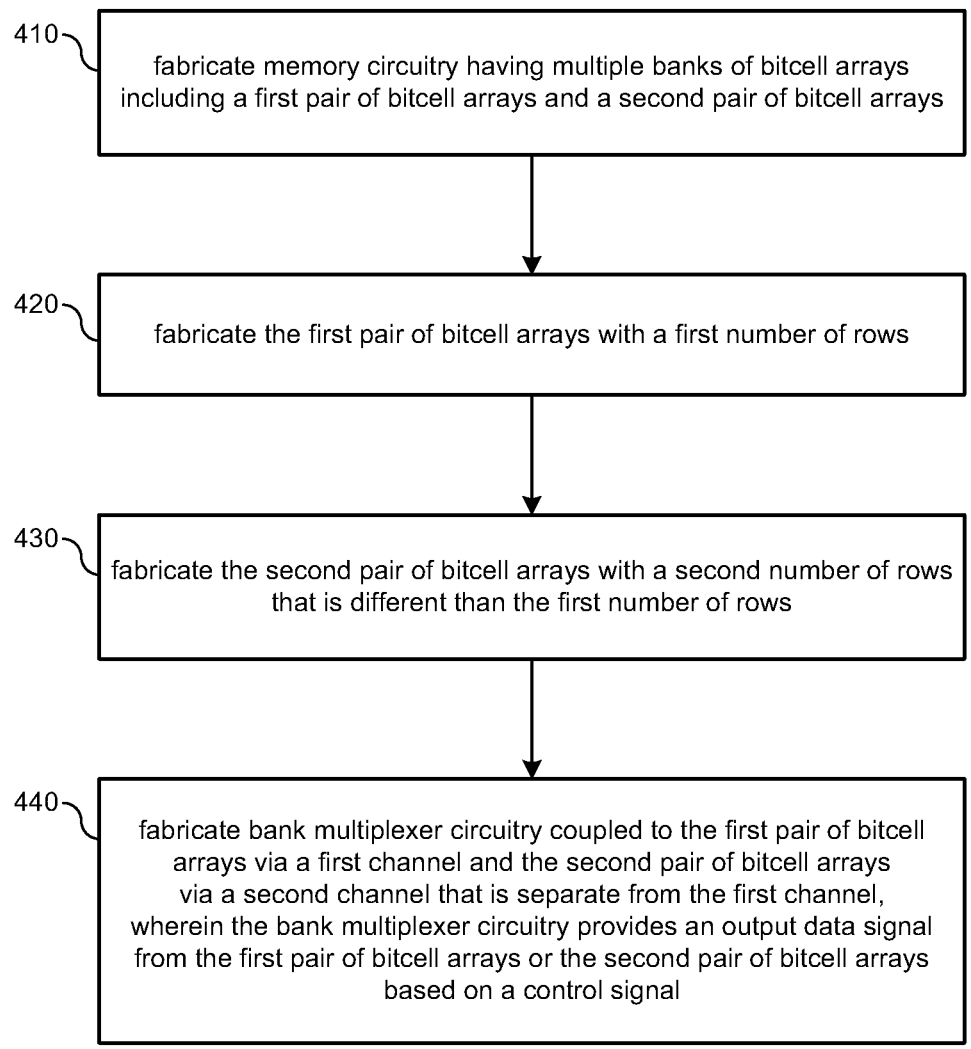
FIG. 4 illustrates a process flow diagram of a method for fabricating integrated circuitry in accordance with various implementations described herein.

FIG. 4 illustrates a process diagram of a method 400 for fabricating integrated circuitry 400 in accordance with various implementations described herein.

It should be understood that even though method 400 may indicate a particular order of operation execution, in some cases, various certain portions of the operations may be executed in a different order, and on different systems. In other cases, additional operations and/or steps may be added to and/or omitted from method 400. Further, method 400 may be implemented in hardware and/or software. If implemented in hardware, the method 400 may be implemented with various circuit components, such as described herein above in reference to FIGS. 1-3. If implemented in software, method 400 may be implemented as a program or software instruction process configured for implementing transition coupling circuitry as described herein. Further, if implemented in software, instructions related to implementing the method 400 may be stored in memory and/or a database. For instance, a computer or various other types of computing devices having a processor and memory may be configured to perform method 400.

As described and shown in reference to FIG. 4, method 400 may be used for manufacturing an integrated circuit (IC) that implements high-speed memory architecture in various types of memory applications. In some implementations, method 400 of FIG. 4 refers to fabricating the memory circuitry 100, 200 of FIGS. 1 and/or 2.

At block 410, method 400 may fabricate memory circuitry having multiple banks of bitcell arrays including a first pair of bank arrays (bottom pair) and a second pair of bank arrays (top pair). The first pair of bank arrays may include a first bank of bitcells arranged in a first array and a second bank of bitcells arranged in a second array. The second pair of bank arrays may include a third bank of bitcells arranged in a third array and a fourth bank of bitcells arranged in a fourth array.

At block 420, method 400 may fabricate the first pair of bank arrays with a first number of rows. At block 430, method 400 may fabricate the second pair of bank arrays with a second number of rows that is different than the first number of rows. The second number of rows may have a sum of rows that is asymmetrically balanced with a sum of rows of the first number of rows. In some instances, the asymmetrical balancing of the second number of rows with respect to the first number of rows may provide a resistive-capacitive (RC) balancing between the multiple banks of bitcell arrays. Also, the second number of rows may be at least less than the first number of rows.

At block 440, method 400 may fabricate bank multiplexer circuitry coupled to the first pair of bank arrays via a first channel (channel 0) and the second pair of bank arrays via a second channel (channel 1) that is separate from the first channel. In this case, the bank multiplexer circuitry provides an output data signal (Q) from the first pair of bank arrays (bottom pair) or the second pair of bank arrays (top pair) based on a control signal (bankmux bit). In some instances, the first channel and the second channel may be implemented with column multiplexer circuitry.

The first bank of bitcells and the second bank of bitcells share the first channel, and the first bank of bitcells is coupled to the first channel with a first bitline, and the second bank of bitcells is coupled to the first channel with a second bitline. The first bitline may provide a first data signal from the first bank of bitcells to the first channel, and the second bitline may provide a second data signal from the second bank of bitcells to the first channel. The first channel may provide the first data signal or the second data signal to the bank multiplexer circuitry for output as the output data signal from the first pair of bank arrays based on the control signal.

Further, the third bank of bitcells and the fourth bank of bitcells share the second channel, and the third bank of bitcells is coupled to the second channel with a third bitline, and the fourth bank of bitcells is coupled to the second channel with a fourth bitline. The third bitline may provide a third data signal from the third bank of bitcells to the second channel, and the fourth bitline may provide a fourth data signal from the fourth bank of bitcells to the second channel. The second channel may provide the third data signal or the fourth data signal to the bank multiplexer circuitry for output as the output data signal from the second pair of bank arrays based on the control signal.

Figure 5:
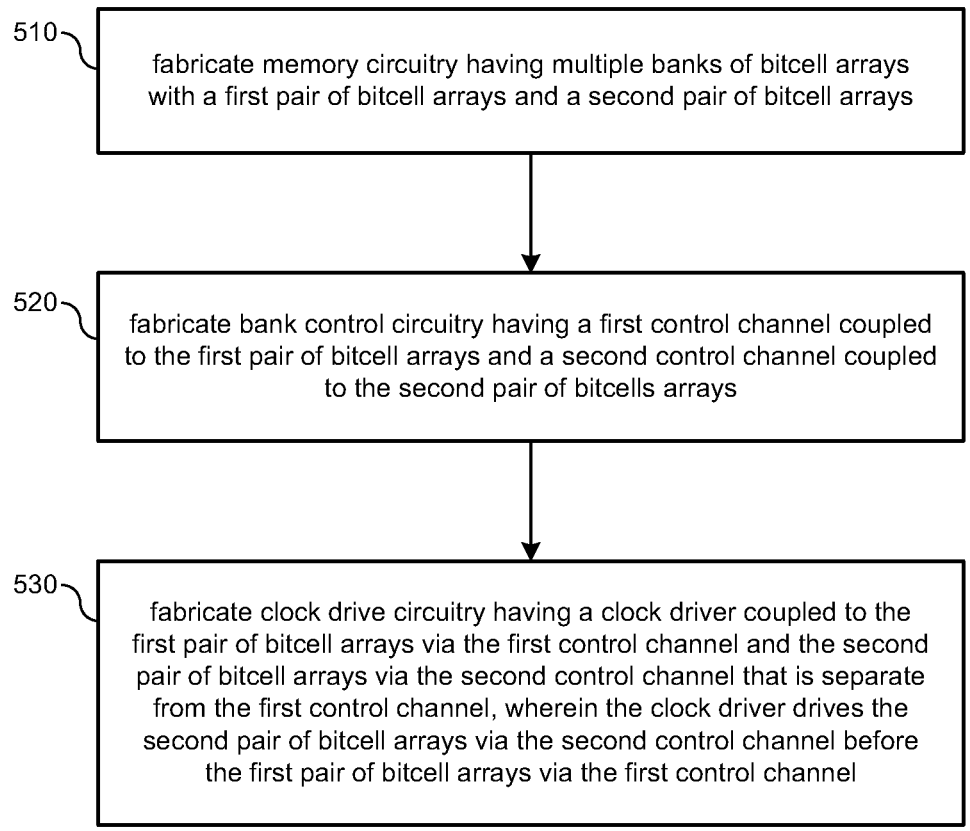
FIG. 5 illustrates a process flow diagram of a method for fabricating integrated circuitry in accordance with various implementations described herein.

FIG. 5 illustrates a process diagram of a method 500 for fabricating integrated circuitry 500 in accordance with various implementations described herein.

It should be understood that even though method 500 may indicate a particular order of operation execution, in some cases, various certain portions of the operations may be executed in a different order, and on different systems. In other cases, additional operations and/or steps may be added to and/or omitted from method 500. Further, method 500 may be implemented in hardware and/or software. If implemented in hardware, the method 500 may be implemented with various circuit components, such as described herein above in reference to FIGS. 1-4. If implemented in software, method 500 may be implemented as a program or software instruction process configured for implementing transition coupling circuitry as described herein. Further, if implemented in software, instructions related to implementing the method 500 may be stored in memory and/or a database. For instance, a computer or various other types of computing devices having a processor and memory may be configured to perform method 500.

As described and shown in reference to FIG. 5, method 500 may be used for manufacturing an integrated circuit (IC) that implements high-speed memory architecture in various types of memory applications. In some implementations, method 500 of FIG. 5 refers to fabricating the memory circuitry 300 of FIG. 3.

At block 510, method 500 may fabricate memory circuitry having multiple banks of bitcell arrays with a first pair of bank arrays (bottom pair) and a second pair of bank arrays (top pair). The first pair of bank arrays may include a first bank of bitcells arranged in a first array and a second bank of bitcells arranged in a second array. The second pair of bank arrays may include a third bank of bitcells arranged in a third array and a fourth bank of bitcells arranged in a fourth array.

At block 520, method 500 may fabricate bank control circuitry having a first control channel coupled to the first pair of bank arrays (bottom pair) and a second control channel coupled to the second pair of bitcells arrays (top pair). As shown in reference to FIG. 3, the first control channel may be referred to as channel 0, and the second control channel may be referred to as channel 1.

At block 530, method 500 may fabricate clock drive circuitry having a clock driver coupled to the first pair of bank arrays (bottom pair) via the first control channel and the second pair of bank arrays (top pair) via the second control channel that is separate from the first control channel. In this instance, the clock driver drives the second pair of bank arrays (top pair) via the second control channel before (or prior to) the first pair of bank arrays (bottom pair) via the first control channel. In some instances, the clock driver may be implemented with a clock buffer that receives a clock input signal and provides a buffered clock signal to the second pair of bank arrays via the second control channel prior to the first pair of bank arrays via the first control channel. Also, the clock buffer may be implemented with an inverter or similar device.

In some implementations, method 500 may also fabricate control drive circuitry having a control driver that is coupled to the first pair of bank arrays (bottom pair) via the first control channel and the second pair of bank arrays (top pair) via the second control channel that is separate from the first control channel. In this instance, the control driver may drive control of the first pair of bank arrays (bottom pair) via the first control channel before the second pair of bank arrays (top pair) via the second control channel.

Described herein are various implementations of an integrated circuit. The integrated circuit may include memory circuitry having multiple banks of bitcell arrays including a first pair of bank arrays and a second pair of bank arrays. The first pair of bank arrays may have a first number of rows, and the second pair of bank arrays may have a second number of rows that is different than the first number of rows. The integrated circuit may include bank multiplexer circuitry that is coupled to the first pair of bank arrays via a first channel and the second pair of bank arrays via a second channel that is separate from the first channel. The bank multiplexer circuitry may provide an output data signal from the first pair of bank arrays or the second pair of bank arrays based on a control signal.

Described herein are various implementations of a method for manufacturing or fabricating an integrated circuit. The method may include fabricating memory circuitry having multiple banks of bitcell arrays including a first pair of bank arrays and a second pair of bank arrays. The method may include fabricating the first pair of bank arrays with a first number of rows. The method may include fabricating the second pair of bank arrays with a second number of rows that is different than the first number of rows. The method may include fabricating bank multiplexer circuitry coupled to the first pair of bank arrays via a first channel and the second pair of bank arrays via a second channel that is separate from the first channel. The bank multiplexer circuitry may provide an output data signal from the first pair of bank arrays or the second pair of bank arrays based on a control signal.

Described herein are various implementations of an integrated circuit. The integrated circuit may include memory circuitry having multiple banks of bitcell arrays with a first pair of bank arrays and a second pair of bank arrays. The integrated circuit may include bank control circuitry having a first control channel coupled to the first pair of bank arrays and a second control channel coupled to the second pair of bitcells arrays. The integrated circuit may include clock drive circuitry having a clock driver coupled to the first pair of bank arrays via the first control channel and the second pair of bank arrays via the second control channel that is separate from the first control channel. The clock driver may drive the second pair of bank arrays via the second control channel before the first pair of bank arrays via the first control channel.

Although particular embodiments have been described herein, it will be apparent that these particular embodiments should not be limited thereto, and that many modifications and/or additions may be made within the particular embodiments of the disclosure. For instance, various combinations of features of the dependent claims may be made with features of the independent claims without departing from the particular embodiments.

Various techniques of embodiments described herein are applicable across a variety of technologies, and for various different types of memory cells. For instance, particular embodiments may be used irrespective of whether individual memory cells are constructed using bulk CMOS (Complementary Metal-Oxide-Semiconductor) technology or constructed using SOI (Silicon-On-Insulator) technology or FinFET technology. Further, various techniques of embodiments described herein are not restricted to memory devices using memory cells, but may be applied to memory devices using various other types of memory cells that are subjected to read and/or write operations.

The discussion provided herein is directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    memory circuitry having multiple banks of bitcell arrays including a first pair of bank arrays and a second pair of bank arrays, wherein the first pair of bank arrays have a first number of rows, and wherein the second pair of bank arrays have a second number of rows that is different than the first number of rows; and
    bank multiplexer circuitry coupled to the first pair of bank arrays via a first channel and the second pair of bank arrays via a second channel that is separate from the first channel, wherein the bank multiplexer circuitry provides an output data signal from the first pair of bank arrays or the second pair of bank arrays based on a control signal.

2. The integrated circuit of claim 1, wherein the second number of rows has a sum of rows that is asymmetrically balanced with a sum of rows of the first number of rows.

3. The integrated circuit of claim 2, wherein the asymmetrical balancing of the second number of rows with respect to the first number of rows provides a resistive-capacitive (RC) balancing between the multiple banks of bitcell arrays.

4. The integrated circuit of claim 1, wherein the second number of rows is less than the first number of rows.

5. The integrated circuit of claim 1, wherein the first pair of bank arrays includes a first bank of bitcells arranged in a first array having the first number of rows, and wherein the first pair of bank arrays includes a second bank of bitcells arranged in a second array having the first number of rows.

6. The integrated circuit of claim 5, wherein the first bank of bitcells and the second bank of bitcells share the first channel, and wherein the first bank of bitcells is coupled to the first channel with a first bitline, and wherein the second bank of bitcells is coupled to the first channel with a second bitline.

7. The integrated circuit of claim 6, wherein the first bitline provides a first data signal from the first bank of bitcells to the first channel, and wherein the second bitline provides a second data signal from the second bank of bitcells to the first channel.

8. The integrated circuit of claim 7, wherein the first channel provides the first data signal or the second data signal to the bank multiplexer circuitry for output as the output data signal from the first pair of bank arrays based on the control signal.

9. The integrated circuit of claim 5, wherein the second pair of bank arrays includes a third bank of bitcells arranged in a third array having the second number of rows, and wherein the second pair of bank arrays includes a fourth bank of bitcells arranged in a fourth array having the second number of rows.

10. The integrated circuit of claim 9, wherein the third bank of bitcells and the fourth bank of bitcells share the second channel, and wherein the third bank of bitcells is coupled to the second channel with a third bitline, and wherein the fourth bank of bitcells is coupled to the second channel with a fourth bitline.

11. The integrated circuit of claim 10, wherein the third bitline provides a third data signal from the third bank of bitcells to the second channel, and wherein the fourth bitline provides a fourth data signal from the fourth bank of bitcells to the second channel.

12. The integrated circuit of claim 11, wherein the second channel provides the third data signal or the fourth data signal to the bank multiplexer circuitry for output as the output data signal from the second pair of bank arrays based on the control signal.

13. The integrated circuit of claim 1, wherein the first channel includes first column multiplexer circuitry with a first sense amplifier having first latch circuitry that provides the output data signal as a latched output data signal, and wherein the second channel includes second column multiplexer circuitry with a second sense amplifier having second latch circuitry that provides the output data signal as another latched output data signal, and wherein the first pair of bank arrays share the first sense amplifier and the first latch circuitry, and wherein the second pair of bitcell arrays share the second sense amplifier and the second latch circuitry.

14. A method, comprising:
    fabricating memory circuitry having multiple banks of bitcell arrays including a first pair of bank arrays and a second pair of bank arrays;
    fabricating the first pair of bank arrays with a first number of rows;
    fabricating the second pair of bank arrays with a second number of rows that is different than the first number of rows; and
    fabricating bank multiplexer circuitry coupled to the first pair of bank arrays via a first channel and the second pair of bank arrays via a second channel that is separate from the first channel, wherein the bank multiplexer circuitry provides an output data signal from the first pair of bank arrays or the second pair of bank arrays based on a control signal.

15. An integrated circuit, comprising:
memory circuitry having multiple banks of bitcell arrays with a first pair of bank arrays and a second pair of bank arrays;
bank control circuitry having a first control channel coupled to the first pair of bank arrays and a second control channel coupled to the second pair of bank arrays; and
clock drive circuitry having a clock driver coupled to the first pair of bank arrays via the first control channel and the second pair of bank arrays via the second control channel that is separate from the first control channel, wherein the clock driver drives the second pair of bank arrays via the second control channel before the first pair of bank arrays via the first control channel.

16. The integrated circuit of claim 15, wherein the clock driver comprises a clock buffer that receives a clock input signal and provides a buffered clock signal to the second pair of bank arrays via the second control channel prior to the first pair of bank arrays via the first control channel.

17. The integrated circuit of claim 16, wherein the clock buffer is implemented with an inverter.

18. The integrated circuit of claim 15, further comprising control drive circuitry having a control driver coupled to the first pair of bank arrays via the first control channel and the second pair of bank arrays via the second control channel that is separate from the first control channel, wherein the control driver drives control of the first pair of bank arrays via the first control channel before the second pair of bank arrays via the second control channel.

19. The integrated circuit of claim 15, wherein the first pair of bank arrays includes a first bank of bitcells arranged in a first array, and wherein the first pair of bank arrays includes a second bank of bitcells arranged in a second array.

20. The integrated circuit of claim 19, wherein the second pair of bank arrays includes a third bank of bitcells arranged in a third array, and wherein the second pair of bank arrays includes a fourth bank of bitcells arranged in a fourth array.

* * * * *